INVENTOR
PHILIP D. WARNER
BY Donald S. Cohen
ATTORNEY

United States Patent Office 3,364,399
Patented Jan. 16, 1968

3,364,399

ARRAY OF TRANSISTORS HAVING A LAYER OF SOFT METAL FILM FOR DIVIDING

Philip D. Warner, Lansdale, Pa., assignor to IRC, Inc., a corporation of Delaware Filed July 15, 1964, Ser. No. 382,858
7 Claims. (Cl. 317—235)

ABSTRACT OF THE DISCLOSURE

A semiconductor device containing a plurality of individual semiconductor elements and fabricated to provide for greater ease of dividing the semiconductor device to separate the individual semiconductor elements. The semiconductor device comprises a wafer of semiconductor material of one conductivity type and having a pair of opposed, substantially flat surfaces. A plurality of spaced areas of a conductivity type opposite to the conductivity type of the wafer are provided in one surface of the wafer to provide the p-n junctions of the individual semiconductor elements. The wafer is adapted to be broken along lines extending between the p-n junction of the individual semiconductor elements to divide the wafer into the individual semiconductor element. A thin metal film is coated on the one surface of the wafer and alloyed with the material of the wafer with the metal film extending over at least the portions of the surface of the wafer along which the wafer is to be broken to divide the wafer into the individual elements. The metal film provides a soft surface which can be easily scribed to permit ease of breaking the wafer.

Semiconductive elements, such as transistors and diodes, are generally made by forming on a relatively large wafer of a semiconductive material, such as silicon, a plurality of the elements. The wafer is then diced to separate the individual elements. By dicing it is meant that the wafer is broken or cut along lines extending between the individual elements. One method of dicing commonly used is to scribe a groove in the surface of the wafer along the desired lines, and then break the wafer along the grooves. However, the ease of carrying out this method of dicing the wafer is affected by the ductility of the material of the wafer, and by a hard oxide protective film which is often used in making the semiconductor elements.

It is an object of the present invention to provide a novel method of fabricating semiconductor devices.

It is another object of the present invention to provide a method for improved scribing of semiconductor wafers which facilitates the dicing of the wafers into individual semiconductor elements.

It is a further object of the present invention to provide a semiconductor wafer with a surface with facilitates scribing a groove therein.

It is a still further object of the present invention to provide a semiconductor wafer with a metal coating on its surface to facilitate scribing a groove in the surface of the wafer.

It is still another object of the present invention to provide a novel construction of a semiconductor element.

Other objects will appear hereinafter.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

Figure 1:
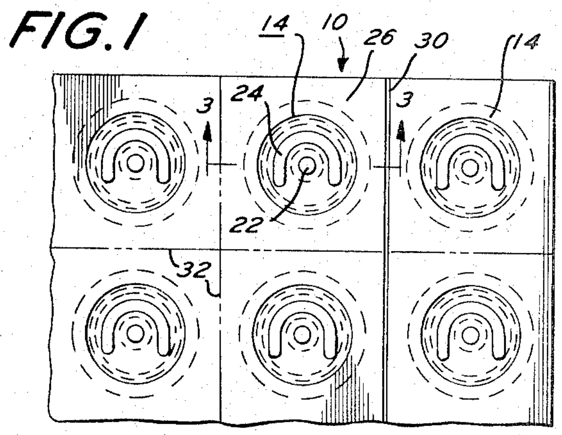
FIGURE 1 is a top plan view of a portion of a semiconductive wafer of the present invention having a plurality of semiconductor elements formed thereon.
Figure 3:
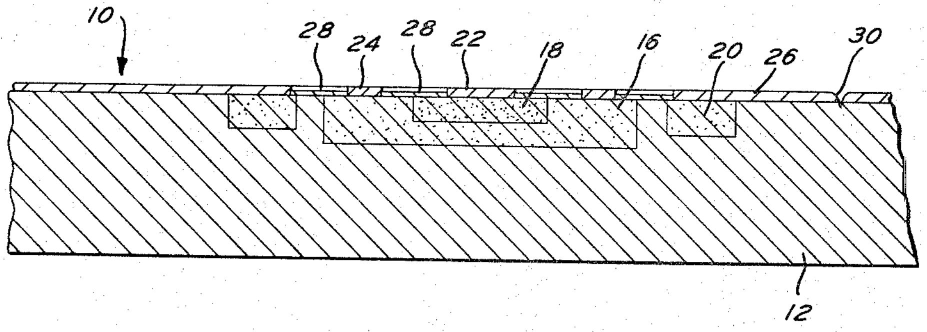
FIGURE 3 is a sectional view taken along line 3—3 of FIGURE 1.

Referring initially to FIGURES 1 and 3, the semiconductor device of the present invention is generally designated as 10.

Semiconductor device 10 comprises a relatively thin, flat wafer 12 of a semiconductor material, such as silicon, of one conductivity type. Formed on the wafer 10 are a plurality of identical semiconductor elements 14. As shown, the semiconductor elements 14 are transistors. Each of the semiconductor elements 14 includes within the wafer 12 a base area 16, an emitter area 18 within the base area 16, and an annular collector area 20 around and spaced from the base area 16. The base area 16 is of a conductivity type opposite to that of the wafer 12. The emitter area 18 and collector area 20 are of the same conductivity type as that of the wafer 12, but more highly doped. Thus, for example, if the wafer 12 is of N type semiconductor material, the base area 16 is of P type and the emitter area 18 and collector area 20 are of N+ type. Likewise, if the wafer 12 is of P type semiconductor material, the base area is of N type and the emitter area 18 and collector area 20 are of P+ type. The base, emitter and collector areas may be formed by any of the techniques well known in the art, such as by diffusing into wafer 12 the proper impurities to provide the particular conductivity types.

Figure 2:
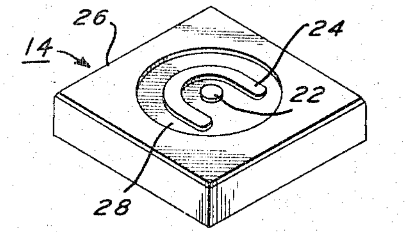
FIGURE 2 is a perspective view of one of the semiconductor elements resulting from the dicing of the wafer of FIGURE 1.

An emitter terminal 22 is provided on the surface of the emitter area 18. A U-shaped base terminal 24 is provided on the surface of the base area 16. A collector terminal 26 is provided on the surface of the collector area 20. The emitter, base and collector terminals 22, 24 and 26 are thin films of an electrically conductive metal, such as aluminum, gold, silver, platinum, copper or an alloy of chromium, nickel and gold. As shown in FIGURES 1–3, the collector terminal 26 extend beyond the outer edge of the collector area 20 and covers the remaining surface of the wafer 12. As shown in FIGURE 3, thin, protective films 28 of silicon oxide cover the surface of the wafer 12 between the emitter terminal 22 and base terminal 24 and between the base terminal 24 and collector terminal 26.

To make the semiconductor elements 14, the wafer 12 is provided with a plurality of the semiconductor elements. This can be achieved by the basic method described in United States Letters Patent No. 3,025,589 to J. A. Hoerni, issued Mar. 20, 1962, entitled "Method of Manufacturing Semiconductor Devices." This method includes coating one surface of the wafer with a protective oxide layer in the manner described in said Patent No. 3,025,589. Holes are etched through the oxide layer to expose the areas of the wafer 12 where the base areas 16 of the semiconductor elements 14 are to be provided. The base areas 16 are then formed by diffusing the proper impurity into the wafer 12, and the base areas 16 are then covered by a protective oxide layer. Holes are then etched through the oxide layer to expose the areas where the emitter areas 18 and collector areas 20 are to be provided. The emitter areas 18 and collector areas 20 are then formed by diffusing the proper impurity into the wafer 12. The emitter areas 18 and collector areas 20 are then coated with the protective oxide layer. The oxide layer is then etched away in the areas where the terminals 22, 24 and 26 are to be formed. This leaves only the oxide films 28 on the surface of the wafer 12. The terminals 22, 24 and 26 are provided on the surface of the wafer 12 by any of the well known techniques for plating with a metal, such as by evaporation of the metal in a vacuum or by pyrolytically decomposing a gas containing the metal and depositing the metal on the surface of the wafer or by electroplating. This completes the semiconductor device 10 which is then diced to form the individual semiconductor elements 14.

To dice the semiconductor device 10, a groove 30 is scribed through the collector terminal layer 26 and the surface of the wafer 12 along a line extending between the semiconductor elements 14. The grooves 30 are provided along the dotted lines 32 in FIGURE 1 so that each semiconductor element 14 is completely surrounded by the grooves. The wafer 12 is then broken along the grooves 30 to separate the individual semiconductor elements 14. It has been found that when the collector terminals 26 are applied to the wafer 12, the metal of the collector terminals, which is softer than the material of the wafer, alloys with the material of the wafer at the surface of the wafer. It has been found that the soft metal layer and the alloy surface layer provides a surface through which the grooves 30 can be more easily scribed for greater ease of dicing the semiconductor device 10 into the individual semiconductor elements 14.

Although the collector area 20 is shown as being a narrow ring surrounding the base area 16, the collector area 20 can extend outwardly to the edge of the semiconductor element 14. Although the collector area 20 is of the same conductivity type as the material of the wafer 12, it has been found that by forming the collector area 20 of a more highly doped area surrounding the opposite conductivity type base area 16, the electrical characteristics of the semiconductor element 14 are improved. It has been found that during the forming of the semiconductor element 14, an inversion layer of the same conductivity type as the base area may be formed on the surface of the wafer. The occurrence of such an inversion layer adversely affects the electrical characteristics of the semiconductor element. However, it has been found that the more highly doped collector area 20 acts as a barrier and limits the formation of the inversion layer so as to improve the electrical characteristics of the semiconductor element.

In addition, by having the collector area 20 on the same surface of the wafer 12 as the base area 16 and emitter area 18, the semiconductor element 14 can be provided with all of its terminals on one side thereof. This provides a semiconductor element which can be easily mounted on a microcircuit assembly and electrically connected to the other electrical elements of the circuit.

Figures 4, 5:
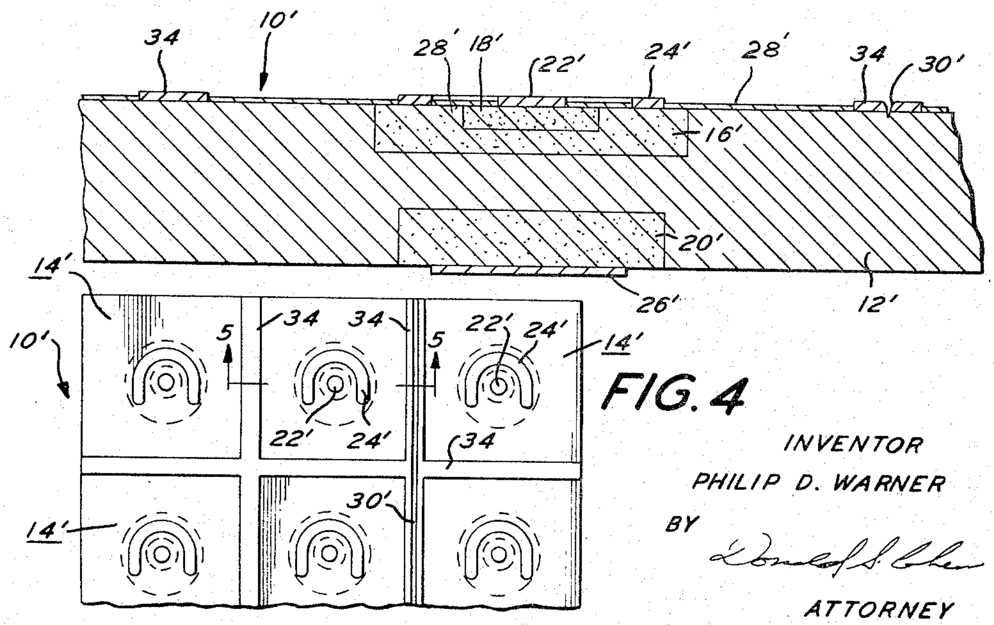
FIGURE 4 is a top plan view of a portion of a modification of the semiconductive wafer of the present invention.
FIGURE 5 is a sectional view taken along line 5—5 of FIGURE 4.

Referring to FIGURES 5 and 6, a modification of the semiconductor device of the present invention is generally designated as 10'.

Semiconductor device 10' comprises a relatively thin, flat wafer 12' of a semiconductor material, such as silicon. Formed on the wafer 12' are a plurality of identical semiconductor elements 14', which are shown to be transistors. Each of the semiconductor elements 14' comprises a base area 16' formed in one surface of the wafer 12', and emitter area 18' within the base area 16', and a collector area 20' formed in the other surface of the wafer opposite the base area 16' and emitter area 18'. The base area 16' is of a conductivity type opposite to that of the wafer 12'. The emitter area 18' and collector area 20' are of the same conductivity type as that of the wafer 12' but more highly doped.

An emitter terminal 22' is provided on the surface of the emitter area 18'. A U-shaped base terminal 24' is provided on the surface of the base area 16'. A collector terminal 26' is provided on the surface of the collector area 20'. The terminals 22', 24' and 26' are thin films of an electrically conductive metal. Narrow strips 34 of a metal film are coated on the surface of the wafer 12' on which the base terminal 24' and emitter terminal 22' are applied. As shown in FIGURE 4, the metal strips 34 extend along lines between the individual semiconductor elements 14' so that each of the semiconductor elements 14' is surrounded by the metal strips. As shown in FIGURE 5, thin, protective films 28' of silicon oxide cover the surface of the wafer 12' between the emitter terminal 22' and the base terminal 24', and between the base terminal 24' and the metal strips 34. The exposed portion of the other surface of the wafer 12' may also be covered by a thin, protective film of silicon oxide.

The semiconductor device 10' is made in substantially the same manner as described above with regard to the semiconductor device 10 of FIGURE 1, except that the collector area 20' and collector terminal 26' are formed on the surface of the wafer 12' opposite to that on which the emitter area 22' and base area 18' are formed. Also, the metal strips 34 are of the same metal and are formed at the same time as the terminals 22' and 24'. After the semiconductor device 10' is completed, it is diced by scribing grooves 30' in the metal strips 34 and the underlying surface of the wafer 12'. The wafer 12' is then broken along the grooves 30' to form the individual semiconductor elements 14'. If desired, the semiconductor elements 14' may be provided with barrier rings around but spaced from the base areas 16' to limit the formation of an inversion layer. Such barrier rings are of the same conductivity type as that of the wafer 12' but more highly doped.

The present invention may be embodied in other specific forms without departing from the spirit or essential attributes thereof and, accordingly, reference should be made to the appended claims, rather than to the foregoing specification as indicating the scope of the invention.

What is claimed is:

1. A semiconductor device comprising a wafer of a semiconductor material of one conductivity type having a pair of opposed substantially flat surfaces, said wafer having in one of said surfaces a plurality of spaced areas of a conductivity type opposite to the conductivity type of the wafer, each of said areas providing with said wafer a p-n junction of a separate semicoductor element, said wafer being adapted to be broken along lines extending between said areas to divide the wafer into the individual semiconductor elements, and a thin film of a soft metal coated on said one surface of the wafer, said metal film extending over the lines along which the wafer is to be broken and being alloyed with the material of the wafer along said lines so as to provide a soft surface which can be easily scribed for ease of breaking the wafer into the individual semiconductor elements.

2. A semiconductor device in accordance with claim 1 in which each of said areas is the base area of its respective semiconductor elements, and each of said semiconductor elements includes an emitter area in said one surface of the wafer and within the base area, and a collector area in a surface of the wafer, said emitter area and collector area of each of the semiconductor elements being of the same conductivity type as the conductivity type of wafer.

3. A semiconductor device in accordance with claim 2 in which the collector area of each of the semiconductor elements is in the same surface of the wafer as the base area and emitter area in surrounding but spaced relation with respect to said base area, and is of a higher conductivity than that of the wafer.

4. A semiconductor device in accordance with claim 3 in which each of the semiconductor elements includes separate metal terminal films on the base area and emitter area, and the thin metal film extends over the collector areas of the semiconductor elements.

5. A semiconductor device in accordance with claim 4 including a protective film of silicon oxide covering the surface of the wafer between the terminal films of each of the semiconductor elements and the thin metal film.

6. A semicoductor device in accordance with claim 2 in which the collector area of each of the semiconductor elements is in the surface of the wafer opposite to the surface in which is provided the base area and emitter area, and the thin metal film is on the same surface of the wafer as the base area and emitter area.

7. A semiconductor device in accordance with claim 6 in which the thin metal film is provided as narrow strips extending between adjacent semiconductor elements.

References Cited

UNITED STATES PATENTS

| | | | |
|---|---|---|---|
| 3,064,167 | 11/1962 | Hoerni | 317—234 |
| 3,092,522 | 6/1963 | Knowles | 148—1.5 |
| 3,197,681 | 7/1965 | Broussard | 317—235 |
| 3,206,827 | 9/1965 | Kreigsman | 29—25.3 |
| 3,275,912 | 9/1966 | Kunz | 317—235 |

JOHN W. HUCKERT, *Primary Examiner.*

M. H. EDLOW, *Assistant Examiner.*